United States Patent [19]

Harris, Jr. et al.

[11] Patent Number: 4,829,204
[45] Date of Patent: May 9, 1989

[54] MIXER HAVING OVERLOAD PROTECTION

[75] Inventors: William S. Harris, Jr., Everett; Hans O. Mortelmans, Edmonds, both of Wash.

[73] Assignee: Hewlett-Packard Company, Palo Alto, Calif.

[21] Appl. No.: 240,391

[22] Filed: Aug. 26, 1988

Related U.S. Application Data

[63] Continuation of Ser. No. 148,193, Jan. 27, 1988, abandoned, which is a continuation of Ser. No. 59,169, Jun. 12, 1987, abandoned, which is a continuation of Ser. No. 521,855, Aug. 10, 1983, abandoned.

[51] Int. Cl.$^4$ .......................... G06G 7/00; H03K 3/01
[52] U.S. Cl. .................................... 307/529; 307/590; 307/321; 307/296.1; 328/143; 328/156; 328/160; 329/166
[58] Field of Search ........... 307/529, 490, 321, 317 R, 307/303, 296.4; 321/166; 328/133, 160, 156, 143

[56] References Cited

U.S. PATENT DOCUMENTS

| | | | |
|---|---|---|---|
| 3,109,939 | 11/1963 | Chin et al. ........................ | 307/88.5 |
| 3,202,921 | 8/1965 | Wissel ................................ | 329/166 |
| 3,436,683 | 4/1969 | Rogers ................................ | 332/47 |
| 4,027,240 | 5/1977 | Meade ................................ | 324/110 |
| 4,253,035 | 2/1981 | Amitay ............................. | 307/270 |

OTHER PUBLICATIONS

"Integrated Electronics", by Millman and Halkias, McGraw Hill.
"Built-In Limiter Gives Mixer High-Power Protections", MIC Microwave & IF/RF Products, p. 8, Supplement B, Spring 1983 Catalog.

*Primary Examiner*—Stanley D. Miller
*Assistant Examiner*—Richard Raseen
*Attorney, Agent, or Firm*—John A. Frazzini

[57] ABSTRACT

A mixer is presented which utilizes a diode bridge having a first input signal imposed across two opposite nodes of the diode bridge and having a second input signal imposed across the other two nodes of the diode bridge. A set of variable impedance devices are included in the mixer to protect the diodes in the diode bridge from overload conditions. These variable impedance devices can be included in each leg of the diode bridge or can be included in the input leads to the loop. The variable impedance devices control the current through the diodes by having a low impedance under non-overload conditions and having a high impedance under overload conditions. A particularly simple choice of the variable impedance device is a FET which has its gate shorted to its source.

6 Claims, 3 Drawing Sheets

MIXER HAVING OVERLOAD PROTECTION

CROSS REFERENCE TO RELATED APPLICATIONS

This patent is a continuation of application Ser. No. 07/148,193, filed Jan. 27, 1988, abandoned, which is a continuation of application Ser. No. 07/059,169, filed June 12, 1987, abandoned, which is a continuation of application Ser. No. 06/521,855, filed Aug. 10, 1983, abandoned.

BACKGROUND OF THE INVENTION

The disclosed invention relates generally to mixers and more particularly to overload protection for mixers. A mixer is used for frequency conversion or phase detection in such applications as spectrum analyzers, selective level meters, phase-locked loops, and radio receivers. One common form of a double-balanced mixer is shown in FIG. 1. The mixer shown there utilizes a diode bridge 10 consisting of four diodes 11-14 connected in series to form a loop. A pair of transformers 17 and 111 are connected to diode bridge 10 to enable input signals from a pair of input sources such as local oscillator 15 and radio frequency source 19 to be applied to the diode bridge. Nodes B and D of the diode bridge are connected to opposite ends of the secondary winding of transformer 17 and the center-tap of this secondary winding is connected to ground. Similarly, nodes A and C of diode bridge 10 are connected to opposite ends of the secondary winding of transformer 111. An output signal is produced at the center-tap of the secondary winding of transformer 111 and is represented in FIG. 1 as the signal IF between this center-tap and ground.

When this mixer is utilized for frequency conversion, the amplitude of the local oscillator input signal is typically selected to be much larger than the amplitude of the radio frequency input signal. Under these conditions, the voltage drops across diodes 11-14 are dominated by the voltage applied to the diode loop by transformer 17. Because of the grounded center-tap of the secondary of transformer 17, the local oscillator tends to drive the voltage of node B to minus the voltage of node D. Therefore, when node B is driven high, diodes 11 and 12 are reverse biased and diodes 13 and 14 are forward biased. This results in a pair of high impedance paths from node A through diodes 11 and 12 to the grounded center-tap of the secondary winding of transformer 17 and also results in a pair of low impedance paths from node C through diodes 13 and 14 to the center-tap of the secondary winding of transformer 17. In effect, the diodes 11-14 act as switches which are individually placed into either their high impedance states or their low impedance states in response to the local oscillator signal.

The diodes 13 and 14 are matched so that under the forward current induced by the local oscillator input signal these two diodes have substantially equal impedance. For such matched impedances and for zero radio frequency input signal, node C will be at ground potential. For a small radio frequency input signal compared to the local oscillator input signal, the voltage of node C will remain substantially at ground potential. However, for such small radio frequency input signals, the large reverse biased impedance of diodes 11 and 12 will result in larger swings in the voltage of node A. In effect, the bottom of the secondary winding of transformer 111 is held at ground potential while the top of this winding is allowed to float (i.e. the large reverse biased impedance of diodes 11 and 12 effectively decouple the top of this winding from nodes B and D). Therefore, the output signal IF equals the signal produced in the lower half of the winding due to the radio frequency input signal.

When the local oscillator input signal swings low, diodes 11 and 12 become forward biased and diodes 13 and 14 become reverse biased. Diodes 11 and 12 are matched so that they have the same forward biased impedance under operating conditions. By the same reasoning used above, it can be seen that now the top of the secondary winding of transformer 111 is held effectively at ground potential and the bottom of that winding is allowed to float. The effect of this is that polarity of the output signal IF reverses each time the polarity of the local oscillator input signal reverses. The output signal is therefore proportional to the product of the radio frequency signal and a square wave of alternating voltages of equal amplitude and opposite polarity. The output signal therefore contains frequencies equal to the frequency of the radio frequency input signal plus or minus integral multiples of the frequency of the local oscillator input signal. In a real mixer there are deviations from the operation discussed above which result in the output signal containing frequencies equal to integral multiples of the frequency of the radio frequency input signal plus or minus integral multiples of the frequency of the local oscillator input signal.

The local oscillator input signal is typically selected to be large enough that the current produced through the forward biased diodes is near the maximum forward biased current which the diodes can handle without being damaged. This is done so that the forward biased impedance is small in order to substantially ground the node between the two forward biased diodes (Note that since the radio frequency input signal is small, the relevant impedance for evaluating the effect of this signal is the differential impedance equal to the derivative of voltage across a diode with respect to the current through the diode—namely dV/dI which is inversely proportional to the current I). Unfortunately, this choice of operating conditions makes these diodes particularly susceptible to damage by input signals larger than rated operating input signals.

In many applications, the mixer is located at an input port of a device so that the local oscillator input signal and/or the radio frequency input signal are supplied by the user. Such a mixer therefore requires protection from input signals which exceed the rated range of the mixer. The primary existing ways to protect against excess power which might damage the diodes are either to tell the user the maximum power allowed and rely on his adherence to such advice (an obviously risky approach) or to place amplifiers or pads ahead of the mixer with built-in overload protection. This overload protection could be in the form of voltage clamps to limit the maximum input voltage to some predetermined value. Another protection scheme is shown in the circuit presented in FIG. 2. In that scheme, each leg of the diode bridge 20 includes a pair of diodes so that the power dropped in any given leg of the diode bridge is split between the two diodes in that pair thereby enabling the diode bridge to handle twice the power without damage. Unfortunately, if this diode bridge has similar operating characteristics to the circuit in FIG. 1, then it should carry the same forward current as the diode bridge in FIG. 1 and therefore requires twice the input power required by the mixer in FIG. 1 and is susceptible to damage by the same percentage increase in power as for the circuit in FIG. 1.

SUMMARY OF THE INVENTION

In accordance with the illustrated preferred embodiment of the invention, a double balanced mixer having inherent overload protection is presented. This mixer utilizes a diode bridge having four legs which are connected at four nodes to form a closed loop. A first input source is connected through a first transformer to a first pair of opposite nodes in the loop and a second input source is connected through a second transformer to the other pair of nodes in the loop. In the preferred embodiment, each leg of the loop includes a diode and a variable impedance device. In an alternative embodiment of the invention, each leg of the loop includes a diode and each lead from one of the transformers to the diode loop includes a variable impedance device.

Each diode has its cathode connected to the anode of one other diode in the loop. In the preferred embodiment, this connection is through a variable impedance device. The center tap of the secondary winding of the first transformer is held at a fixed voltage $V_1$. The output signal is produced as the difference between the voltage of the center tap of the secondary winding of the second transformer and the voltage $V_0$. The four diodes are matched and the four variable impedance devices are matched so that under recommended operating conditions they have the same characteristics. This choice of matching nearly eliminates the components of the output signal IF at the frequencies of the input signals. This is advantageous because the components of most interest in the output signal are at the sum or difference of the input signals.

The variable impedance devices can assume a number of forms but they must have low impedance at the conditions at which the circuit is rated to work and have high impedance when the input signals rise sufficiently above the rated operating conditions that damage would occur to the diode bridge but for the addition of the variable impedance devices. In the preferred embodiment, JFET's having their gate shorted either to their sources or to their drains are utilized as the variable impedance devices.

DESCRIPTION OF THE PREFERRED EMBODIMENT

Figure 3:
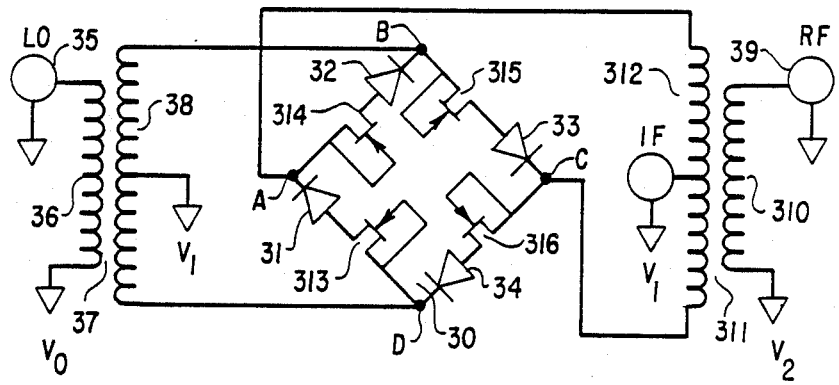
In FIG. 3 is shown the preferred embodiment of a double balanced mixer having inherent overload protection.

In FIG. 3 is shown the preferred embodiment of a double balanced mixer having inherent overvoltage protection. That mixer utilizes a diode bridge 30 having four legs which are connected together at a set of nodes A,B,C and D to form a loop ABCD. In each leg of diode bridge 30 is one of diodes 31-34. The cathode of each of these diodes is connected through a variable impedance device to the anode of one other of these diodes.

A first input signal is provided by an input signal source such as local oscillator 35. In some applications, this input signal is provided by the user and is totally under the user's control. Local oscillator 35 is connected to one end of the primary winding 36 of a first transformer 37. The other end of this primary winding is held at a reference potential $V_0$ which in this embodiment is chosen to be ground potential. The secondary winding 38 of transformer 37 has one end connected to node B, has one end connected to node D and has its center tap held at a reference potential $V_1$ which in this embodiment is chosen to be at ground potential.

A second input signal is provided by an input signal source such as radio frequency source 39. This signal is typically supplied by the user and in other embodiments of this mixer need not produce radio frequency signals. Radio frequency source 39 is connected to one end of the primary winding 310 of a second transformer 311. The other end of this primary winding is held at a reference voltage $V_2$ which in this embodiment is chosen to be ground potential. The secondary winding 312 of transformer 311 has one end connected to node A and has one end connected to node C. The output signal IF appears as the voltage difference between the center tap of winding 312 and the reference voltage $V_1$.

Figure 4:
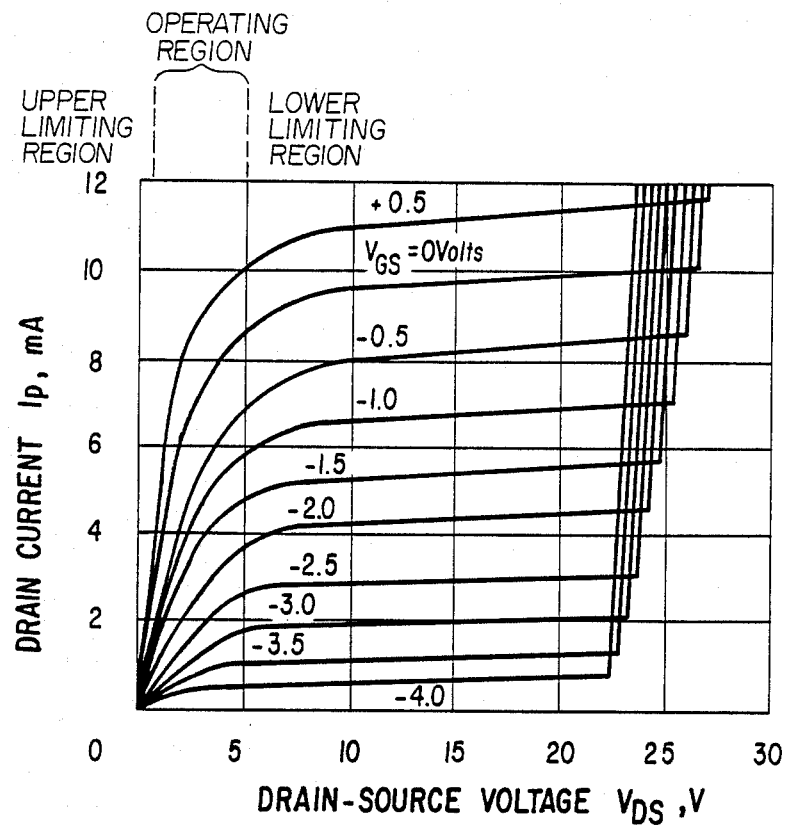
In FIG. 4 are shown curves representing drain current as a function of the drain to source voltage of a JFET.

In each leg of diode bridge 30 is a variable impedance device such as JFETs 313-316. Each of the JFETs is associated with the diode in its leg of the bridge to provide that diode with inherent overvoltage protection. Each of the JFETs has its gate shorted to its source so that at low drain current $I_D$ the source to drain impedance is small and at large values of $I_D$ this impedance becomes very large. The behavior of such a JFET can be seen as the curve marked $V_{GS}=0$ in FIG. 4. Each of these JFETs is selected so that when the mixer is operated in non-overload conditions and its associated diode is forward biased, the source to drain impedance of the JFET is on the order of or less than the impedance of its associated diode. Each of these JFET's is also selected so that as the current through its associated diode approaches the maximum diode current which that diode can carry without damage, its differential impedance increases sharply (it should become larger than the differential impedance of its associated diode and preferably several orders of magnitude larger) thereby tending to limit the current through its associated diode. In effect, the JFETs make a transition from a low differential impedance state to a high differential impedance state at a current level near but less than the maximum current level of its associated diode (eg. at 90% of the maximum current level). As can be seen in FIG. 4, the JFET has an initial quasi-linear region (the low differential impedance state) near $I_D=0$ where the JFET has a differential impedance (ie. dV/dI) several orders of magnitude smaller than at higher current levels where the curves again become quasi-linear (the high differential impedance state). The JFETs used in the circuit of FIG. 3 are selected so that under non-overload conditions, the forward biased current through the diodes lies in the quasi-linear region near $I_D=0$ and the maximum diode current lies in the other quasi-linear region. The JFETs are also matched so that when the diodes on each side of node C are forward biased, node C will be essentially at voltage $V_1$ and when the diodes on each side of node A are forward biased then node A will be essentially at voltage $V_1$.

The curves of drain current as a function of the gate to source voltage have the same qualitative shape for a MOSFET as the same curves for a JFET. Therefore, another simple choice for the variable impedance devices is a set of MOSFETs having their gates shorted to their sources. For an FET having its gate shorted to its source (i.e., the input from which majority carriers are supplied) the resulting characteristics are as shown in FIG. 4 so that either n- or p-channel FETs can be used. Because the curves for non-zero gate to source voltage are similar to the curve for zero gate to source voltage, more complicated variable impedance devices which make the gate to source voltage be a function of the drain current can be used. Such devices can be designed to have a sharper transition from the low impedance state to the high impedance state, but at the disadvantage of increased complexity.

Figure 5:
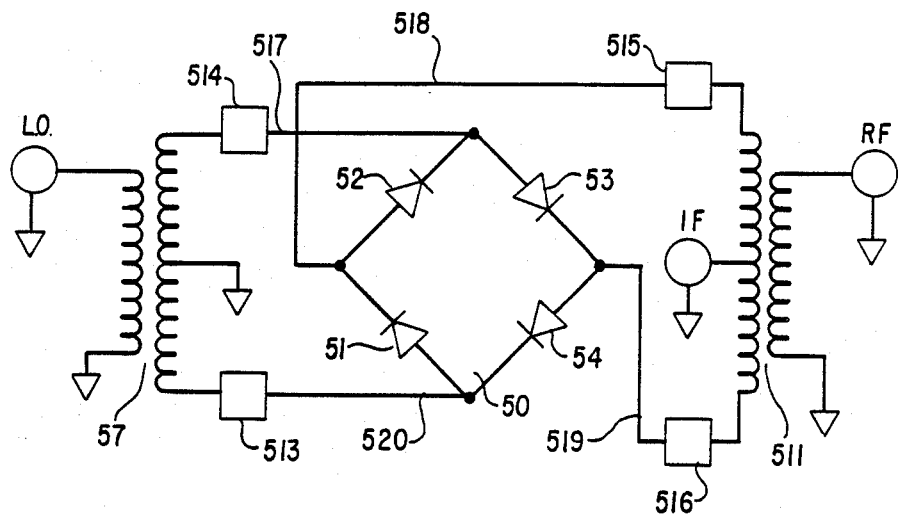
In FIG. 5 is shown an alternative embodiment of a double balanced mixer having inherent overload protection.
Figure 6:
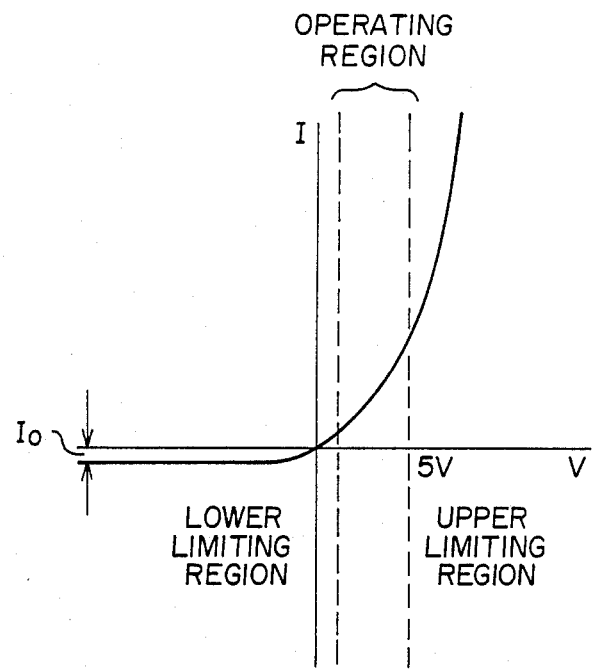
In FIG. 6 is shown a diode curve illustrating operating region and the lower and upper limiting region.

In FIG. 5 is shown an alternate embodiment of the disclosed invention. In that embodiment, diodes 51–54 in diode bridge 50 are protected from overloads by including in each of the four leads 517–520 from transformers 57 and 511 one of the variable impedance devices 513–516. These variable impedance devices are selected by the same criteria as were utilized for the embodiment shown in FIG. 3—namely, that these variable impedance devices be matched, that they have an impedance on the order less than the forward biased impedance of diodes 51–54 under non-overload conditions and that they have a differential impedance much larger than diodes 51–54 as the current through these variable impedance devices approaches the maximum diode current of diodes 51–54.

There is, however, one important distinction of variable impedance sources 513–516 compared to sources 313–316—sources 513–516 need to be bilateral. In the circuit in FIG. 3, diodes 31 and 32 essentially prevent current flow in the direction from B to C. Therefore, variable impedance sources need not be bilateral, but instead need only have the desired characteristics for one direction of current flow—namely, for the direction from B to C. In contrast, sources 513–516 must be bilateral devices because both polarities of current need to flow through these devices and the necessity of limiting current flow is a function of the current amplitude rather than its polarity. A suitable choice for variable impedance sources 513–516 is a bilaterial constant-current source as presented at page 114 in the text entitled "Field Effect Transistors" written by L. J. Sevin and publishd by McGraw-Hill in 1965.

Figure 1:
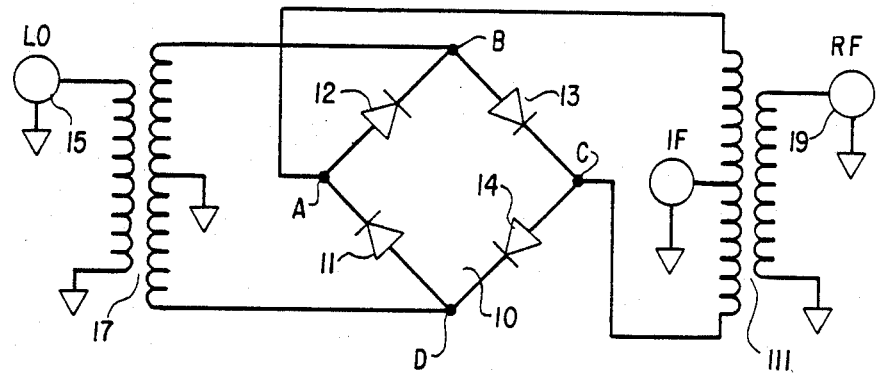
In FIG. 1 is shown a prior art double balanced mixer having no inherent overload protection.
Figure 2:
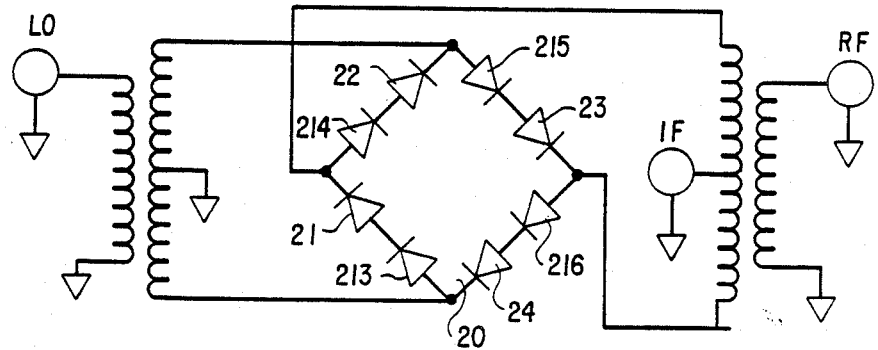
In FIG. 2 is shown a prior art double balanced mixer having additional diodes to provide some overload protection.

The disclosed invention has wider application than only to double balanced mixers of the type shown in FIG. 1. In general, mixers utilize at least one non-linear device which produces in response to a pair of input signals an output signal which includes Fourier components which are the sum or difference of integral multiples of the Fourier components of the input signals. Various particular designs of mixers are selected to suppress particular Fourier components of the output signal (e.g. so that components at integral multiples of the input signals are suppressed). In many mixers, the non-linear device is an impedance element which is connected in series with the input sources and has an impedance which is a function of the current through it. In order to function as a mixer, this impedance must produce a voltage drop which, in the operating region of the mixer, is a non-linear function of the current through it. In order to achieve overvoltage protection, its differential impedance should increase sharply in a pair of adjacent limiting regions which sandwich the operating region. Since the differential impedance of a diode increases sharply under reverse biased conditions, it has some inherent overload protection in one adjacent limiting region. Unfortunately, there is no corresponding large increase in the differential impedance under large forward bias conditions. Therefore, overvoltage protection is provided in the other adjacent limiting region by including in series with it a variable impedance device (such as the JFETs or the MOSFETS) which makes a transition from a low to a high impedance state as the current level exceeds the range of the operating region.

We claim:

1. A mixer of the type having a first input port, a second input port and an output port, each of said input ports having an input impedance and said output port having an output impedance, said mixer further comprising:

impedance means, responsive to the amplitude of an input signal applied to the first input port for changing the input impedance of the first input port from a low impedance state to a high impedance state when the amplitude of this input signal exceeds a threshold value.

2. A mixer as in claim 1 wherein:

said mixer is a diode bridge having a set of four legs which are connected at a set of nodes A, B, C, D to form a loop ABCD, each leg including a diode which has its anode connected to the cathode of one other diode in the loop;

said first input port has a first input connected by a first input lead to node B and a second input connected by a second input lead to node D;

said second input port has a first input connected by a first input lead to node A and a second input connected by a second input lead to node C; and wherein said impedance means comprises a nonlinear impedance in each leg of the diode bridge, each of these nonlinear impedances switching from a low impedance state to a high impedance state when the amplitude of the input signal exceeds said threshold value.

3. A mixer as in claim 2 wherein each of said nonlinear impedances comprises an active device.

4. A mixer as in claim 3 wherein said nonlinear service is a JFET having its gate shorted to its source.

5. A mixer as in claim 1 wherein:

said first input port comprises a transformer having a primary and a tapped secondary with the tap held at a fixed voltage, said tap dividing the secondary into a first secondary lead and a second secondary lead; and said impedance means comprises a nonlinear impedance in each secondary lead, each of these nonlinear impedances switching from a low impedance state to a high impedance state when the forward bias amplitude of the input signal exceeds said threshold value.

6. A mixer as in claim 5 wherein:

said second input port comprises a transformer having a primary and a tapped secondary with the tap held at a fixed voltage, said tap dividing this secondary into a third secondary lead and a fourth secondary lead; and said impedance means comprises a nonlinear impedance in each of the third and fourth secondary leads, each of these nonlinear impedances switching from a low impedance state to a high impedance state when the amplitude of the input signal exceeds said threshold value.

* * * * *

UNITED STATES PATENT AND TRADEMARK OFFICE
CERTIFICATE OF CORRECTION

PATENT NO. : 4,829,204

DATED : May 9, 1989

INVENTOR(S) : William S. Harris, Jr.,; Hans O. Mortelmans

It is certified that error appears in the above-identified patent and that said Letters Patent is hereby corrected as shown below:

Column 2, line 8, delete "forward bi sed and" and insert "forward biased and--

Signed and Sealed this

Thirteenth Day of March, 1990

Attest:

JEFFREY M. SAMUELS

*Attesting Officer*     Acting Commissioner of Patents and Trademarks